(12) United States Patent
Lee

(10) Patent No.: US 7,426,153 B2
(45) Date of Patent: Sep. 16, 2008

(54) CLOCK-INDEPENDENT MODE REGISTER SETTING METHODS AND APPARATUSES

(75) Inventor: Hyong-Yong Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 249 days.

(21) Appl. No.: 11/481,187

(22) Filed: Jul. 6, 2006

(65) Prior Publication Data

US 2007/0008810 A1 Jan. 11, 2007

(30) Foreign Application Priority Data

Jul. 6, 2005 (KR) ...................... 10-2005-0060791

(51) Int. Cl.
*G11C 8/18* (2006.01)
(52) U.S. Cl. ................. 365/233.5; 365/240; 365/230.06
(58) Field of Classification Search .............. 365/233.5, 365/240, 230.06, 189.12
See application file for complete search history.

(56) References Cited

U.S. PATENT DOCUMENTS

2004/0100853 A1 * 5/2004 Choi et al. ............. 365/230.08
2006/0098514 A1 * 5/2006 Kang ..................... 365/230.03

FOREIGN PATENT DOCUMENTS

| KR | 1020010065910 A | 7/2001 |
| KR | 1020040003562 A | 1/2004 |
| KR | 1020040095892 A | 11/2004 |

* cited by examiner

*Primary Examiner*—Anh Phung
*Assistant Examiner*—Toan Le
(74) *Attorney, Agent, or Firm*—Harness, Dickey & Pierce, P.L.C.

(57) ABSTRACT

Mode register setting methods and apparatuses for semiconductor devices are provided in order to suppress a limit in the frequency at which a mode register of a semiconductor device operates from occurring before the semiconductor device carries out a typical write or read operation, as the frequency at which the semiconductor device operates increases. The mode register setting methods and apparatuses may be applied, for example, to DDR-type semiconductor devices. If a chip selection signal /CS maintains a logic low level for at least a first amount of time, a semiconductor device may initiate a clock-independent mode register setting operation. In the clock-independent mode register setting operation, a mode register set (MRS) command and an MRS code bit may be sampled when the logic level of a data strobe signal applied to the semiconductor device transitions from a logic low level to a logic high level. Therefore, it is possible to solve the problem of restrictions regarding the operating frequency of the mode register of the semiconductor device by performing a test mode register setting operation independent of a clock signal applied to the semiconductor device.

20 Claims, 6 Drawing Sheets

CLOCK-INDEPENDENT MODE REGISTER SETTING METHODS AND APPARATUSES

PRIORITY STATEMENT

This application claims priority under 35 U.S.C. §119 to Korean Patent Application No. 10-2005-0060791, filed on Jul. 6, 2005, in the Korean Intellectual Property Office (KIPO), the entire contents of which is incorporated herein by reference.

BACKGROUND

1. Field of the Invention

Example embodiments of the present invention relate to semiconductor memory devices, for example, apparatuses for setting and/or selecting a mode register set in response to an input address and methods for the same.

2. Description of the Conventional Art

Synchronous memory devices (e.g., DDR SDRAMs, etc.) may include a conventional mode register for setting various parameters corresponding to product specifications and/or a test mode register for improving product efficiency when analyzing memory devices. In this way, mode register setting operations may be carried out in response to a clock signal.

FIG. 1 is a block diagram of a conventional mode register setting apparatus for performing a test mode register setting operation. The test mode setting operation may be performed in response to a clock signal.

A mode register set (MRS) command may be applied to a synchronous semiconductor memory device together with an address set. The MRS may be used for determining various factors related to an operating mode of a synchronous semiconductor memory device, for example, CAS latency and/or burst length. When an MRS command is applied to the synchronous semiconductor memory device together with an address set (e.g., A7='1'), the synchronous semiconductor memory device may enter a test mode.

A test mode may be an operating mode for efficiently testing a semiconductor memory device when it is manufactured. A user may set parameters related to the operating mode of the semiconductor memory device, for example, CAS latency and/or burst length. The test mode may be set in response to an address applied with an MRS command during manufacture of the semiconductor memory device.

Referring to FIG. 1, the conventional mode register setting apparatus may include a command decoder 11, an address set decoder 12, and/or a D flip-flop 13.

The command decoder 11 may output an MRS command MRS CMD in response to a plurality of input signals. The plurality of input signals may include a chip selection signal /CS, a row address strobe signal /RAS, a column address signal /CAS, and/or a write enable signal /WE. The command decoder 11 may output an MRS command MRS CMD with a logic high level in synchronization with a clock signal CLK when the chip selection signal /CS, the row address strobe signal /RAS, the column address signal /CAS, and/or the write enable signal /WE become logic low level.

The address set decoder 12 may output an address set signal MRS CODE in response to a plurality of memory address signals A0 through An-1. The address set signal MRS CODE may be enabled when the plurality of memory address signals A0 through An-1 match a given, desired, or designated address set.

The D flip-flop 13 may receive the MRS command MRS CMD output by the command decoder 11 through a clock input port and may receive the address set signal MRS CODE through a D input port. The D flip-flop 13 may be set in response to the address set signal MRS CODE and the MRS command MRS CMD, and may output a test mode activation signal TM. The test mode activation signal TM may enable a test mode.

The conventional mode register setting apparatus of FIG. 2 operates in synchronization with the clock signal CLK which may restrict the frequency of a test MRS as the frequency of the semiconductor memory device increases.

FIG. 2 is an example timing diagram illustrating a tCK Schmoo analysis during a clock period T1. The clock period T1 may correspond to a mode register setting period and/or a normal mode operating period. A test MRS command may be applied during a mode register setting period. In one example, if a tCK limit is detected before test MRS command application, a desired test mode may not be set as desired. This may limit the analysis of tCK margin variations in a normal mode. Accordingly, the tCK Schmoo analysis may not be performed as desired.

FIG. 3 is an example timing diagram illustrating a tCK Schmoo analysis during a clock period T2. The clock period T2 may correspond to a mode register setting period. A clock period T1 may correspond to a normal mode operating period. The detection of a tCK limit at the beginning of a mode register setting period may be suppressed due to the clock period being T2. Thus, the tCK Schmoo analysis may be carried out in a normal mode operating period. However, the example shown in FIG. 2 may result in varying clock periods and/or frequency variations (e.g. DLL locking).

SUMMARY

Example embodiments of the present invention provide mode register setting apparatuses, and methods for the same, which may be less restricted by operating frequencies of mode registers in synchronous semiconductor memory devices.

Example embodiments of the present invention provide mode register setting apparatuses, and methods for the same, in which mode registers of semiconductor memory devices may set more freely, regardless of the frequency of a clock signal.

In at least one example embodiment of the present invention, whether a logic level of a first control signal input to a first input pin of the semiconductor device transitions from a second logic level to a first logic level may be determined. The logic level of a second control signal input to a second input pin of the semiconductor device may be transitioned while the first control signal maintains the first logic level for a first amount of time. The MRS may be set using a mode register setting command signal and/or an address signal when the logic level of the second control signal transitions to a second logic level. The second control signal may maintain the second logic level for at least one cycle of the clock signal.

In example embodiments of the present invention, the second control signal may maintain the changed logic level for one cycle of a clock signal. The second control signal may maintain the changed logic level for any number of cycles of a clock signal. The amount of time at which the first control signal may maintain a logic level may be determined by a plurality of flip-flops connected in series. The plurality of flip-flops may be synchronized with the clock signal, and may transmit the first control signal through the plurality of flip-flops.

In example embodiments of the present invention, an MRS initiation detection signals may be generated if the first control signal maintains the first level for a given amount of time.

The setting may include setting the MRS in response to MRS initiation detection signals, for example, when the logic level of the second control signal transitions.

Another example embodiment of the present invention provides a mode register setting apparatus for setting a mode register set (MRS) of a semiconductor device. The mode register setting apparatus may include a MRS initiation determination circuit. The MRS initiation determination circuit may generate, during any stage of initializing the semiconductor device, a MRS initiation detection signal when a first control signal transitions to a first logic level and maintains the first logic level for a given amount of time. The mode register setting apparatus may further include a mode register setting control circuit. The mode register setting control circuit may output a mode register setting control signal in response to the MRS initiation detection signal and a second control signal transitioning to a second logic level. The second control signal may maintain the second logic level for at least one cycle of a clock signal.

In example embodiments of the present invention, the second control signal may maintain the second logic level for one or a plurality of clock cycles.

According to example embodiments of the present invention, a mode register setting apparatus may further include a mode register setting circuit, which may set the MRS in response to the mode register setting control signal using mode register setting command signals and/or an address signal. The MRS initiation determination circuit may determine an amount of time to maintain a logic level by transmitting the control signal through a plurality of flip-flops. The plurality of flip-flops may be connected in series and may operate in synchronization with the clock signal.

At least one other example embodiment of the present invention provides a mode register setting apparatus for setting a mode register set (MRS) of a semiconductor device. The mode register setting apparatus may include a mode register setting control circuit. The mode register setting control circuit may output a mode register setting control signal in response to a detection signal, a clock signal, and/or a first control signal transitioning to a first logic level. The first control signal may be independent of the clock signal. The mode register setting apparatus may include a mode register setting circuit for setting the mode register set in response to the mode register setting control signal using a mode register setting command signal and/or an address signal.

BRIEF DESCRIPTION OF THE DRAWINGS

The accompanying drawings are intended to depict example embodiments of the present invention and should not be interpreted to limit the scope thereof. The accompanying drawings are not to be considered as drawn to scale unless explicitly noted. The present invention will become more apparent by describing in detail example embodiments thereof with reference to the attached drawings in which.

Figure 1:
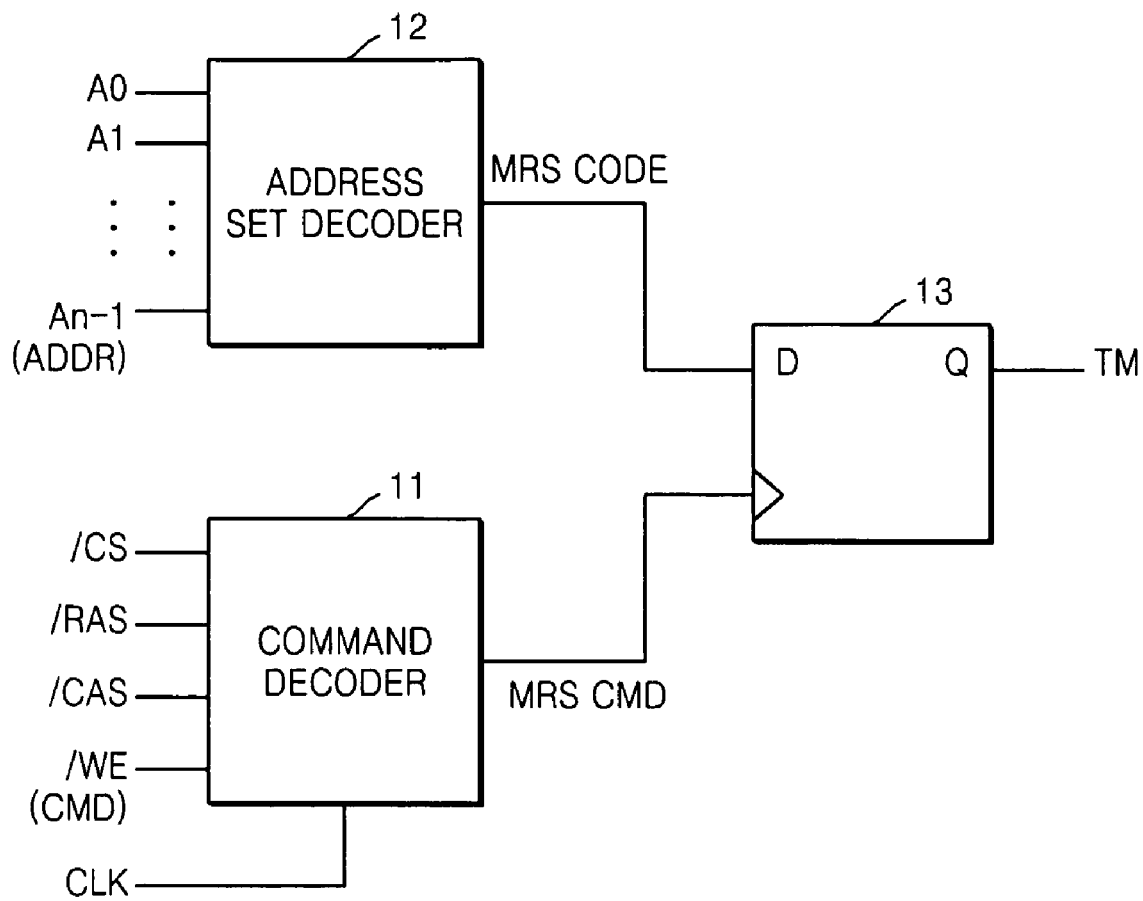
FIG. 1 is an example block diagram of a conventional mode register setting apparatus.
Figure 2:
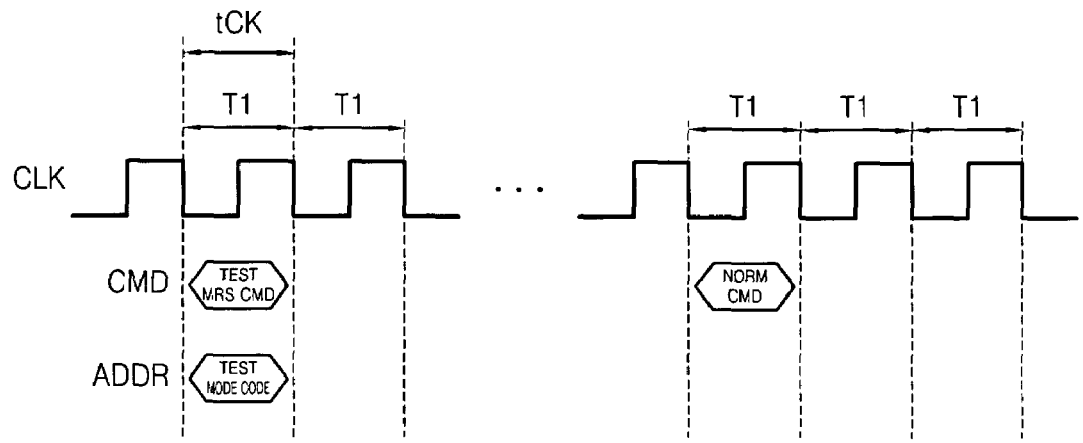
FIG. 2 is an example timing diagram illustrating a clock period reduced to Ti for both a mode register setting period and a write/read operation period for a tCK Schmoo analysis.
Figure 3:
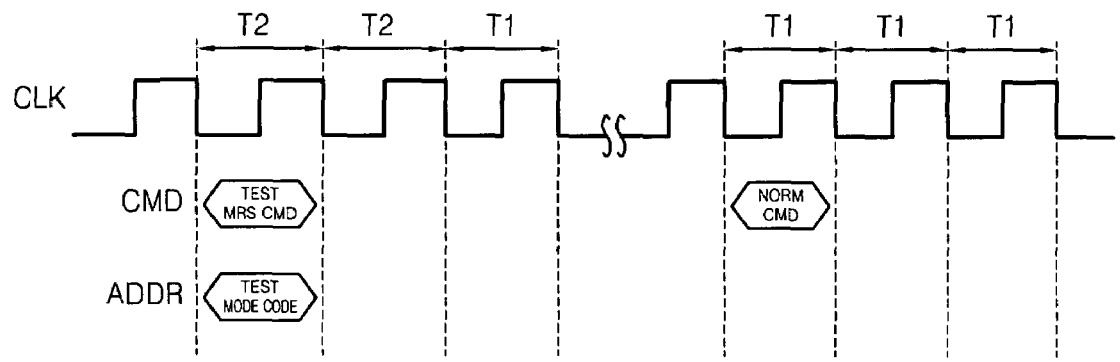
FIG. 3 is an example timing diagram illustrating a clock period fixed at T2 for a mode register setting period and reduced to T1 for a normal mode operating period for a tCK Schmoo analysis.

DETAILED DESCRIPTION OF EXAMPLE
EMBODIMENTS OF THE PRESENT
INVENTION

Example embodiments of the present invention are described more fully hereinafter with reference to the accompanying drawings, in which example embodiments of the invention are shown. This invention may, however, be embodied in many different forms and should not be construed as limited to the example embodiments of the present invention set forth herein. Rather, these example embodiments of the present invention are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout the figures and specification. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including", when used in this specification, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention will now be described more fully with reference to the accompanying drawings. In the drawings, like reference numerals represent like elements.

Figure 4:
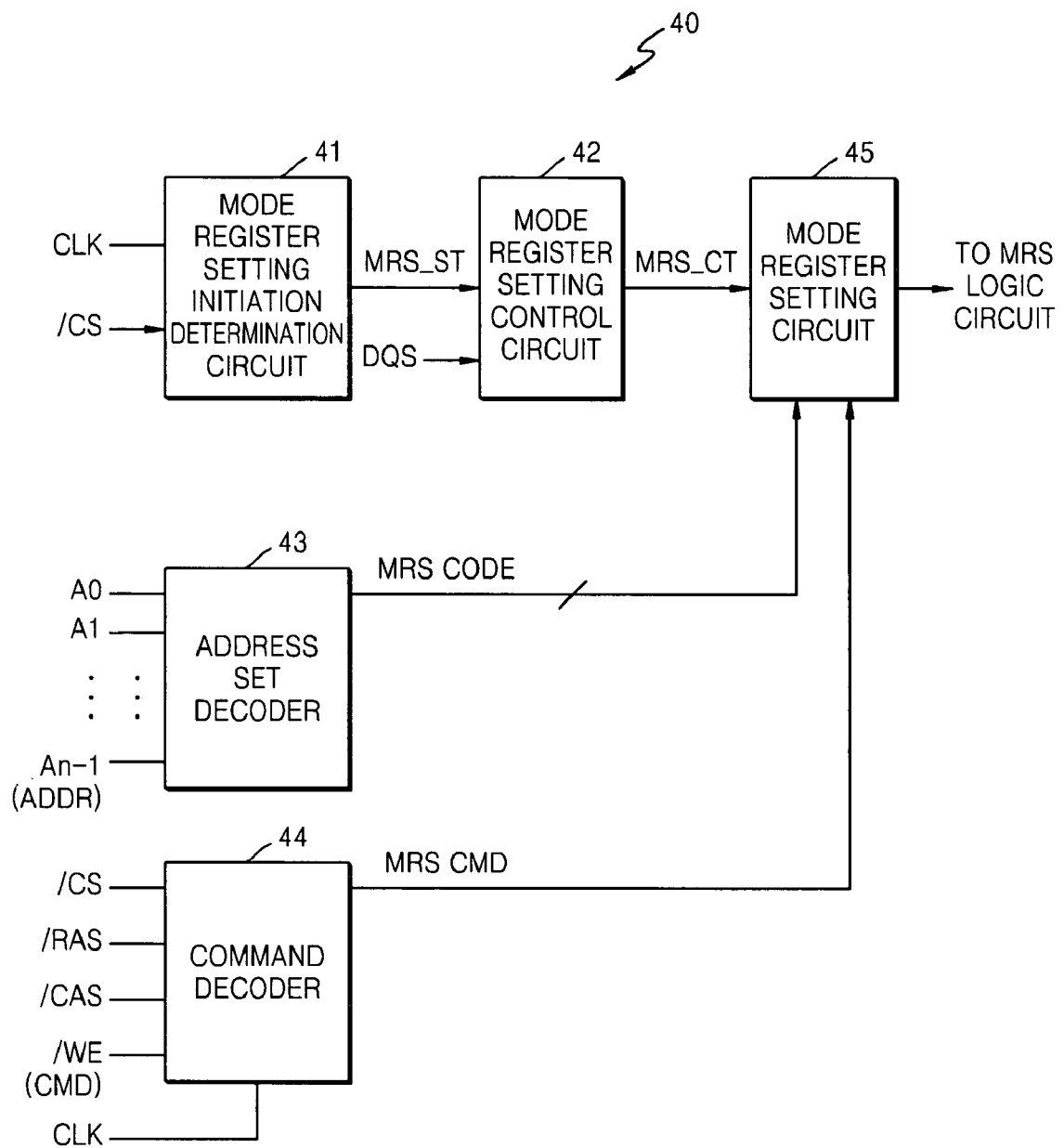
FIG. 4 is a block diagram of a clock-independent mode register setting apparatus, according to an example embodiment of the present invention.

FIG. 4 is a block diagram of a clock-independent mode register setting apparatus, according to an example embodiment of the present invention. As shown, the clock-independent mode register setting apparatus 40 may include a mode register setting initiation determination circuit 41, a mode register setting control circuit 42, an address set decoder 43, a command decoder 44, and/or a mode register setting circuit 45.

Referring to FIG. 4, the mode register setting initiation determination circuit 41 may receive a clock signal CLK and a chip selection signal /CS. If the chip selection signal /CS maintains a logic low level for a given or designated amount of time after transitioning to the logic low level, the mode register setting initiation determination circuit 41 may output a mode register setting initiation detection signal MRS_ST to the mode register setting control circuit 42. The mode register setting initiation detection signal MRS_ST may enable a clock-independent MRS operation.

To determine whether the chip selection signal maintains a logic low level for a given amount of time, the mode register setting initiation determination circuit 41 may sample the chip select signal /CS when the logic level of the clock signal CLK transitions from a logic high level to a logic low level.

The mode register setting control circuit 42 may output a mode register setting control signal MRS_CT in response to the mode register setting initiation detection signal MRS_ST and a transition of the logic level of a data strobe signal DQS input to the semiconductor memory device from a logic low level to a logic high level.

The address set decoder 43 may output an MRS code signal MRS CODE in response to a plurality of memory address signals A0 through An-1. The plurality of memory address signals A0 through An-1 may be applied from an external source. The MRS code signal MRS CODE may be enabled when the plurality of memory address signals A0 through An-1 match a given set of addresses. The MRS code signal MRS CODE may indicate whether a current mode is a test mode or a normal operation mode.

The command decoder 44 may output the MRS command MRS CMD in response to at least one of a plurality of input signals. The plurality of input signals may include the chip selection signal /CS, a row address strobe signal /RAS, a column address signal /CAS, a write enable signal /WE, and/or any other suitable signal. Although example embodiments of the present invention have been described with regard to the chip select signal being input to the mode register setting initiation determination circuit 41, it will be understood that the row address strobe signal /RAS, column address signal /CAS, write enable signal /WE, and/or any other suitable signal may be used.

The mode register setting circuit 45 may perform a mode register setting operation in response to the mode register setting control signal MRS_CT, the MRS code MRS CODE output by the address set decoder 43, and/or the MRS command MRS CMD output by the command decoder 44.

According to at least one example embodiment of the present invention, the mode register setting apparatus 40 may initiate an MRS mode in synchronization with the data strobe signal DQS and independent of the clock signal CLK. The data strobe signal DQS may have a period greater than or equal to that of the clock signal CLK, and as a result, even when the period of the clock signal CLK is reduced, the likelihood of a tCK limit occurring too early may be suppressed.

A clock-independent mode register setting apparatus, according to an example embodiment of the present invention, has been described as initiating a mode register operation in synchronization with the data strobe signal DQS. However, the clock-independent mode register setting apparatus may initiate a mode register setting operation in synchronization with any other suitable signal having a period greater than or equal to the clock signal CLK.

The time interval during which the data strobe signal DQS is at a logic high level may be set by an external controller (not shown) such that the clock-independent mode register setting apparatus may initiate an MRS mode more stably.

Figure 5:
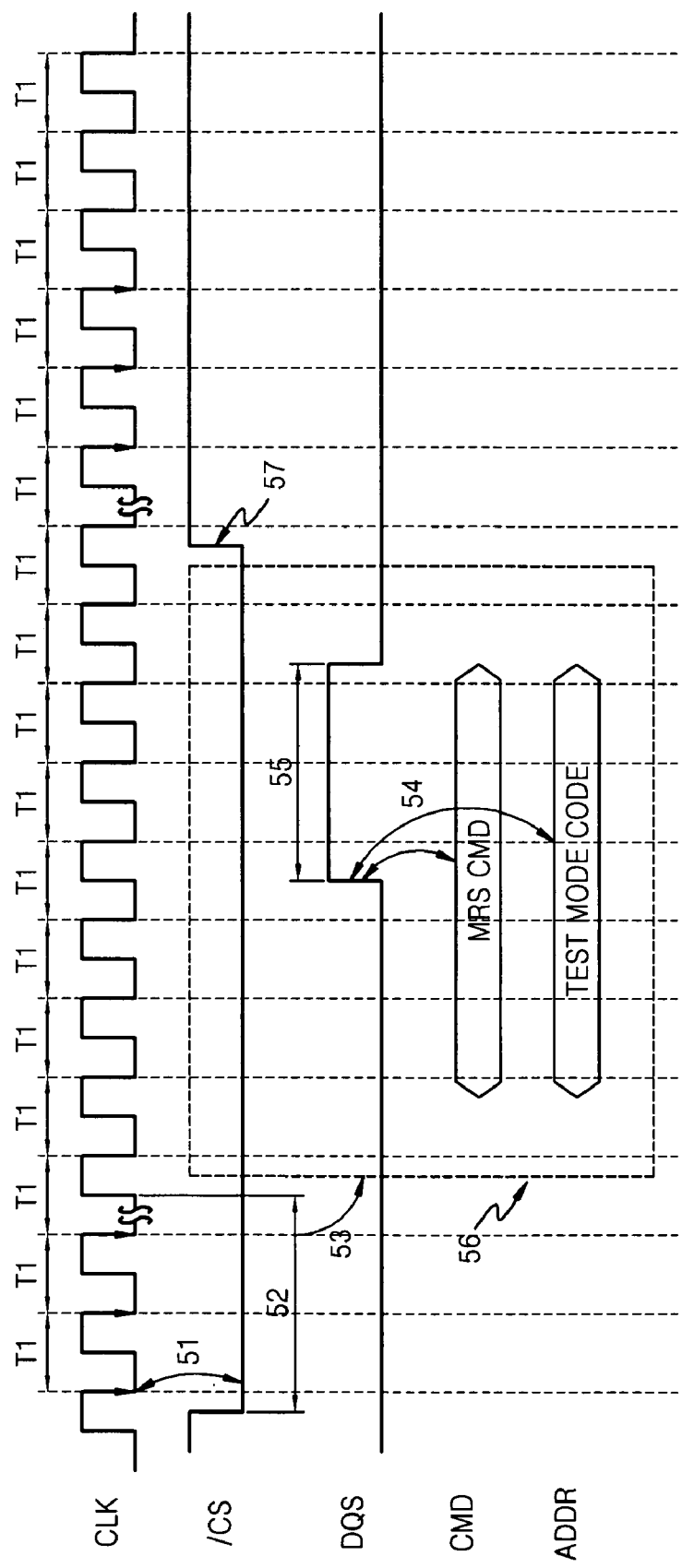
FIG. 5 is a timing diagram illustrating a clock-independent mode register setting method performed by a clock-independent mode register setting apparatus, according to an example embodiment of the present invention.

FIG. 5 is an example timing diagram illustrating a clock-independent mode register setting method, according to an example embodiment of the present invention. As shown, the mode register setting initiation determination circuit 41 may sample a chip selection signal /CS when the logic level of a clock signal CK transitions from a logic high level to a logic low level (51). If the sampled chip selection signal /CS is determined to have maintained a logic low level for a given amount of time (52), the clock-independent mode register setting apparatus 40 may initiate an MRS mode (53). In an MRS mode setting period (56), an external controller (not shown) may generate an MRS command MRS CMD setting an MRS of a semiconductor memory device, and may transmit a test mode code (e.g., an MRS code). The test mode code may indicate a test mode with or without an address signal ADDR.

The mode register setting control circuit 42 may transmit a mode register setting control signal MRS_CT, for example, when a data strobe signal DQS transitions to a logic high level (55). The mode register setting circuit 45 may receive the MRS command MRS CMD and the MRS code MRS CODE and may set a test mode (54) in synchronization with the data strobe signal DQS. The data strobe signal DQS may have a period greater than or equal to that of the clock signal CLK.

The clock-independent MRS mode may be terminated, for example, when the logic level of the chip selection signal /CS transitions from a logic low level to a logic high level (57).

Figure 6:
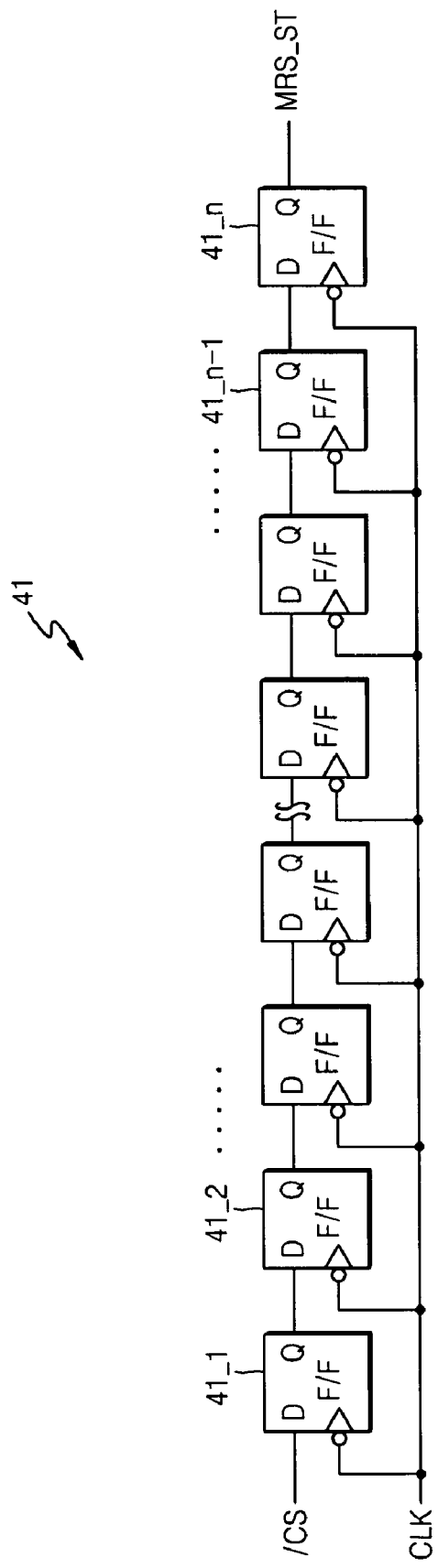
FIG. 6 illustrates a circuit for determining when to initiate and/or terminate a clock-independent MRS operation, according to an example embodiment of the present invention.

FIG. 6 illustrates a mode register setting initiation determination circuit, according to an example embodiment of the present invention. The mode register setting initiation determination circuit 41 may include a plurality of flip-flops 41_1 through 41_n which may be connected in series. An input/output (I/O) node of each of the plurality of flip-flops 41_1 through 41_n may be set at a first logic level (e.g., a logic high level). Each of the plurality of flip-flops 41_1 through 41__n_ may be driven by the logic level of a clock signal CLK transitioning from a logic high level (H) to a logic low level (L).

In example operation, flip-flop 41_1 may transmit a chip selection signal /CS to flip-flop 41_2 when the logic level of the clock signal CLK transitions from a logic high level to a logic low level, flip-flop 41_2 may transmit the output of the flip-flop 41_1 to the flip-flop 41_3 when the logic level of the clock signal CLK transitions from a logic high level to a logic low level, and so on, until flip-flop 41__n_ outputs an output of the flip-flop 41__n_-1 as a mode register setting initiation detection signal MRS_ST.

According to at least some example embodiments of the present invention, the duration for which the chip selection signal maintains a logic low level after the logic level of the clock signal CLK transitions from a logic high level to a logic low level may be determined by the number n of the plurality of flip-flops 41_1 through 41__n_ and/or a clock signal CLK. As a result, a clock-independent MRS mode may be initiated more stably even as the frequency of the clock signal CLK increases. If the chip selection signal /CS maintains a logic low level for n×2 cycles of the clock signal CLK, the mode register setting initiation detection signal MRS_ST output by the flip-flop 41__n_ may transition to a logic low level.

In a normal mode operation, the chip selection signal /CS may transition to a logic high level as the logic level of the clock signal CLK transitions from a logic high level to a logic low level. In this example, the mode register setting initiation detection signal MRS_ST may maintain a logic high level.

Figure 7:
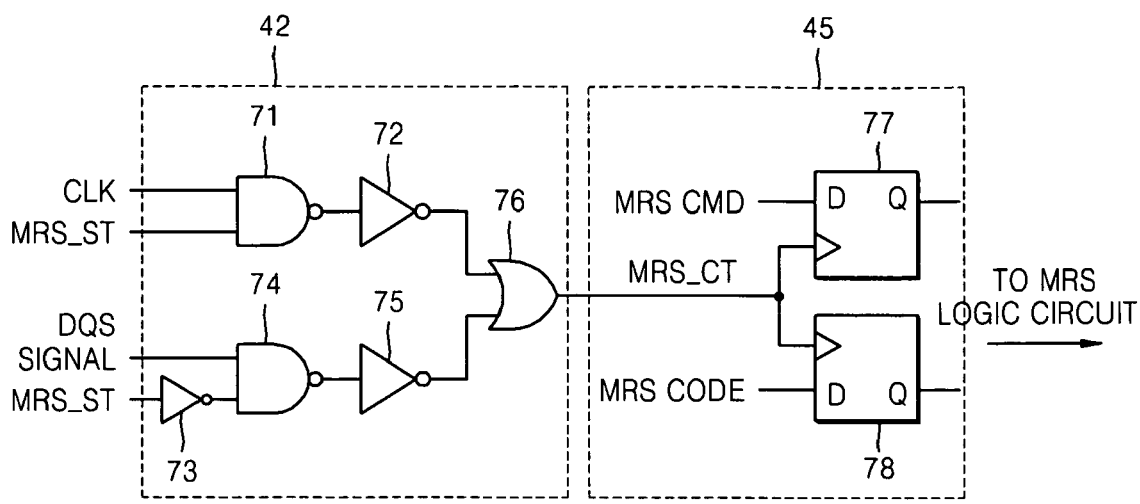
FIG. 7 is illustrates a clock-independent mode register setting control circuit and a mode register setting circuit, according to an example embodiment of the present invention.

FIG. 7 illustrates a mode register setting control circuit and a mode register setting circuit, according to an example embodiment of the present invention. As shown, in a mode register setting control circuit 42, a NAND gate 71 may receive a clock signal CLK and a mode register setting initiation detection signal MRS_ST. An inverter 73 may invert the mode register setting initiation detection signal MRS_ST, and a NAND gate 74 may perform a NAND operation on a data strobe signal DQS and an output of the inverter 73. An inverter 75 may invert an output of the NAND gate 74, and an OR gate 76 may perform an OR operation on an output of the inverter 72 and an output of the inverter 75. The output of the OR gate 76 may be a mode register setting control signal MRS_CT.

Still referring to FIG. 7, in the mode register setting circuit 45, a flip-flop 77 may transmit an MRS command MRS CMD to an MRS logic circuit (not shown) when the mode register setting control signal MRS_CT transitions to a logic high level. Flip-flop 78 may transmit an MRS code to the MRS logic circuit when the mode register setting control signal MRS_CT transitions to a logic high level.

In one example, when the mode register initiation detection signal MRS_ST is at a logic high level, the NAND gate 71 may be an inverter, and the output of the inverter 72 may be the clock signal CLK. The output of the inverter 73 may transition to a logic low level, and the output of the NAND gate 74 may transition to a logic high level regardless of the logic level of the data strobe signal DQS. In this example, the output of the inverter 75 may transition to a logic low level. As a result, the output of the OR gate 76 may become the output of the inverter 72. According to at least some example embodiments of the present invention, when the mode register setting initiation detection signal MRS_ST is at a logic high level, the output of the OR gate 76 (e.g., the mode register setting control signal MRS_CT) may be the same as the clock signal CLK, and the mode register setting circuit 45 may perform a mode register setting operation in synchronization with the clock signal CLK.

In another example where the mode register setting initiation detection signal MRS_ST is at a logic low level, the output of the NAND gate 71 may be at a logic high level, and the output of the inverter 72 may be at a logic low level. The output of the inverter 73 may be at a logic high level, and the output of the inverter 75 may be the same as the data strobe signal DQS. As a result, the output of the OR gate 76 may be the same as the output of the inverter 75. In this example, when the mode register setting initiation detection signal MRS_ST is at a logic low level, the output of the OR gate 76 may be the same as the data strobe signal DQS, and the mode register setting control signal MRS_CT may transition to a logic low level when the data strobe signal DQS transitions to a logic low level.

Flip-flops 77 and 78 may sample the MRS command and the MRS code when the data strobe signal DQS transitions to a logic low level by transmitting the MRS command and the MRS code to the MRS logic circuit when the logic level of the mode register setting control signal MRS_CT transitions from a logic high level to a logic low level. In this example, a mode register setting operation may be performed regardless of the clock signal CLK, and the MRS command and the MRS code may be applied to the MRS logic circuit in synchronization with the data strobe signal DQS. The data strobe signal DQS may have a period greater than or equal to the clock signal CLK regardless of the frequency of the clock signal CLK.

According to example embodiments of the present invention, mode register setting operations may be terminated by applying a chip selection signal /CS with a logic high level as the logic level of an arbitrary clock signal CLK, applied after the generation of the MRS command MRS CMD, transitions from a logic high level to a logic low level. The duration for which the chip selection signal /CS maintains a logic high level may be determined by multiplying the number n of the plurality of flip-flops 41_1 through 41__n_ (e.g., n multiplied by the period of the clock signal CLK).

Although discussed above with regard to the NAND gate 71, the inverter 72, the NAND gate 74, and/or the inverter 75, these logic gates may be replaced with any suitable combination of logic gates, for example, with AND gates.

Clock-independent mode register setting apparatuses, and methods for the same, according to example embodiments of the present invention, may be less affected by frequency restrictions associated with a mode register setting operation, and as a result, example embodiments of the present invention may suppress a tCK limit from occurring too early in a mode register setting period, for example, even when the operating frequency of a synchronous semiconductor memory device increases.

Example embodiments of the present invention provide more efficient higher-frequency mode analysis, such as tCK Schmoo analysis, through the application of a plurality of MRS commands regardless of the frequency at which a synchronous semiconductor memory device operates. In addition, causes of problems (e.g., faults, etc.) in a normal mode may be diagnosed more easily by setting a test mode MRS independently of a clock signal.

Although example embodiments of the present invention have been described, it will be obvious that the same may be varied in many ways. Such variations are not to be regarded as a departure from the spirit and scope of the present invention, and all such modifications are intended to be included within the scope of the present invention.

What is claimed is:

1. A clock-independent mode register setting method comprising:
   detecting a transition of a first control signal to a first logic level;
   transitioning a second control signal to a second logic level if the first control signal maintains the first logic level for a first time period and a data strobe signal transitions to a third logic level; and
   setting a mode register set using at least one of a mode register setting command signal and an address signal based on the transitioning of the second control signal, and independent of a clock signal.

2. The clock-independent mode register setting method of claim 1,
   wherein the second control signal maintains the second logic level for at least one clock cycle.

3. The clock-independent mode register setting method of claim 1,
   wherein the second control signal maintains the second logic level for a plurality of clock cycles.

4. The clock-independent mode register setting method of claim 1, wherein the first control signal is a chip selection signal, and a duration for which the second control signal maintains the second logic level is determined by an external controller.

5. The clock-independent mode register setting method of claim 4, wherein the first control signal transitions to the first logic level in response to at least one transition of the clock signal.

6. The clock-independent mode register setting method of claim 1, wherein the first time period is determined based on a number of flip-flops connected in series, the flip-flops being synchronized with the clock signal.

7. The clock-independent mode register setting method of claim 1, further including,
   transitioning a detection signal if the first control signal maintains the first level for at least the first time period, wherein
   the mode register set is set in response to the transitioning of the detection signal and the transition the data strobe signal.

8. A clock-independent mode register setting apparatus comprising:
   a determination circuit for detecting a transition of a first control signal to a first logic level, and transitioning a detection signal if the first control signal maintains the first logic level for a first time period; and
   a mode register setting control circuit for outputting a mode register setting control signal in response to the transitioning of the detection signal and a transition of a data strobe signal to a second logic level, the data strobe signal maintaining the second logic level for at least one clock cycle.

9. The clock-independent mode register setting apparatus of claim 8,
   wherein the data strobe signal maintains the second logic level for one clock cycle.

10. The clock-independent mode register setting apparatus of claim 8,
    wherein the data strobe signal maintains the second logic level for a plurality of clock cycles.

11. The clock-independent mode register setting apparatus of claim 8, further including,
    a mode register setting circuit for setting the mode register in response to the mode register set control signal and based on a mode register setting command signal and an address signal.

12. The clock-independent mode register setting apparatus of claim 11, wherein the first control signal is a chip selection signal, and a duration for which the mode register set control signal maintains the second logic level is based on the data strobe signal, the data strobe signal being set by an external controller.

13. The clock-independent mode register setting apparatus of claim 11, wherein the determination circuit determines the first time period based on a number of flip-flops connected in series and operated in synchronization with a clock signal.

14. The clock-independent mode register setting apparatus of claim 13, wherein an output of a last flip-flop in the plurality of flip-flops is the detection signal.

15. The clock-independent mode register setting apparatus of claim 11, wherein the control circuit further includes,
    a first AND gate for performing an AND operation on the detection signal and the clock signal,
    an inverter for inverting the detection signal and outputting an inverted signal,
    a second AND gate for performing an AND operation on the inverted signal and the data strobe signal, and
    an OR gate for performing an OR operation on an output of the first AND gate and an output of the second AND gate, and outputting a result of the OR operation as the mode register setting control signal.

16. The clock-independent mode register setting apparatus of claim 15, wherein the control circuit further includes,
    a first flip-flop for outputting the mode register setting command to the mode register setting circuit in response to the mode register set control signal, and
    a second flip-flop for outputting an address set to the mode register setting circuit in response to the mode register set control signal.

17. A clock-independent mode register setting apparatus for setting a mode register set of a semiconductor device, the clock-independent mode register setting apparatus comprising:
    a mode register setting control circuit for outputting a mode register set control signal in response to a detection signal, a clock signal, and a transition of a data strobe signal, at least the mode register set control signal being independent of the clock signal; and
    a mode register setting circuit for setting the mode register set in response to the mode register set control signal using a mode register setting command signal and an address signal.

18. The clock-independent mode register setting apparatus of claim 17, further including,
    a detection circuit for generating the detection signal based on a duration of time over which a first control signal maintains a first logic level.

19. The clock-independent mode register setting apparatus of claim 17, wherein the a mode register setting control circuit further includes,
    a first AND gate for performing an AND operation on the detection signal and the clock signal,
    an inverter for inverting the detection signal and outputting an inverted signal,
    a second AND gate for performing an AND operation on the inverted signal and the detection signal, and an OR gate for performing an OR operation on an output of the first AND gate and an output of the second AND gate, and outputting a result of the OR operation as the mode register set control signal.

20. The clock-independent mode register setting apparatus of claim 17, wherein the mode register setting circuit further includes, a first flip-flop for outputting the mode register setting command to the mode register setting circuit in response to the mode register set control signal, and a second flip-flop for outputting an address set to the mode register setting circuit in response to the mode register set control circuit.

* * * * *